(12) United States Patent
Jin et al.

(10) Patent No.: US 11,687,819 B2
(45) Date of Patent: Jun. 27, 2023

(54) HIGH-FIDELITY SUPERCONDUCTING CIRCUIT STRUCTURE, SUPERCONDUCTING QUANTUM CHIP, AND SUPERCONDUCTING QUANTUM COMPUTER

(71) Applicant: Beijing Baidu Netcom Science and Technology Co., LTD., Beijing (CN)

(72) Inventors: Lijing Jin, Beijing (CN); Runyao Duan, Beijing (CN)

(73) Assignee: BEIJING BAIDU NETCOM SCIENCE AND TECHNOLOGY CO., LTD., Beijing (CN)

(*) Notice: Subject to any disclaimer, the term of this patent is extended or adjusted under 35 U.S.C. 154(b) by 82 days.

(21) Appl. No.: 17/209,031

(22) Filed: Mar. 22, 2021

(65) Prior Publication Data
US 2021/0209498 A1 Jul. 8, 2021

(30) Foreign Application Priority Data
Jul. 15, 2020 (CN) .......................... 202010682384.5

(51) Int. Cl.
*G06N 10/00* (2022.01)
*H10N 60/12* (2023.01)
*H10N 60/80* (2023.01)

(52) U.S. Cl.
CPC ............. *G06N 10/00* (2019.01); *H10N 60/12* (2023.02); *H10N 60/805* (2023.02)

(58) Field of Classification Search
None
See application file for complete search history.

(56) References Cited

U.S. PATENT DOCUMENTS

| 10,352,992 B1 | 7/2019 | Zeng et al. |
| 10,468,578 B2 | 11/2019 | Elsherbini et al. |
| 2016/0132785 A1 | 5/2016 | Amin et al. |
| 2017/0193388 A1 | 7/2017 | Filipp et al. |

(Continued)

FOREIGN PATENT DOCUMENTS

| CN | 102039109 A | 5/2011 |
| CN | 106773612 A | 5/2017 |

(Continued)

OTHER PUBLICATIONS

Koch et al., "Charge-insensitive qubit design derived from the Cooper pair box," Physical Review A 76, 042319 2007 (Year: 2007).*

(Continued)

*Primary Examiner* — Matthew L Reames
(74) *Attorney, Agent, or Firm* — Morrison & Foerster LLP

(57) ABSTRACT

The present disclosure discloses a high-fidelity superconducting circuit structure, a superconducting quantum chip, and a superconducting quantum computer, which relate to the field of quantum computation. The specific implementation is as follows: computation qubits; a coupling device configured to be coupled with two computation qubits, respectively; a connecting component disposed between a computation qubit and the coupling device to couple the computation qubit with the coupling device, so as to implement a target quantum gate based on the coupling device and the computation qubit.

16 Claims, 3 Drawing Sheets

(56) References Cited

U.S. PATENT DOCUMENTS

| | | | |
|---|---|---|---|
| 2017/0262765 | A1 | 9/2017 | Bourassa |
| 2019/0081629 | A1 | 3/2019 | Reagor et al. |
| 2019/0294991 | A1 | 9/2019 | Flipp et al. |

FOREIGN PATENT DOCUMENTS

| | | |
|---|---|---|
| CN | 109389223 A | 2/2019 |
| CN | 109840596 A | 6/2019 |
| CN | 110024292 A | 7/2019 |
| CN | 110472740 A | 11/2019 |
| CN | 110738320 A | 1/2020 |
| CN | 110825375 A | 2/2020 |
| CN | 111164619 A | 5/2020 |
| CN | 111183433 A | 5/2020 |
| CN | 111183435 A | 5/2020 |
| CN | 111260068 A | 6/2020 |
| WO | WO-2017115160 A1 | 7/2017 |

OTHER PUBLICATIONS

Yan, Fei, et al. "Tunable Coupling Scheme for Implementing High-Fidelity Two-Qubit Gates." Physical Review Applied, vol. 10, No. 5, Nov. 2018. (Year: 2018).*

Krantz, P., Kjaergaard, M., Yan, F. et al (2019). A quantum engineer's guide to superconducting qubits. Applied Physics Reviews, 6(2). http://dx.doi.org/10.1063/1.5089550 (Year: 2019).*

Office Action for Chinese Patent Application No. 202010682384.5, dated Aug. 20, 2021. 14 pages. English translation and Official copy.

Search Report for Chinese Patent Application No. 202010682384.5, dated Aug. 13, 2021, 3 pages. English translation and Official copy.

Notification to Grant and Supplementary Search Report for Chinese Patent Application No. 202010682384.5, dated Dec. 28, 2021. 7 pages. English translation and Official copy.

Dimov et al., (2005). "Investigation of the Parasitic Coupling Effects in Densely Packaged RSFQ Digital Circuits," IEEE Transactions on Applied Superconductivity, 15(2):396-399.

Office Action for Chinese Patent Application No. 2020106823845, dated Jun. 18, 2021. 8 pages. English translation and Official copy.

Search Report for Chinese Patent Application No. 2020106823845, dated Jun. 11, 2021, 8 pages. English translation and Official copy.

Tian et al., (2016). "Investigation on Maintaining Entanglement of Two Qubits in Ultrastrong Coupling Region," Acta Optica Sinica, 36(4), 8 pages. English Abstract Only.

Zhang et al., (2002). "Scheme of Quantum iSWAP Gate Composed of Superconducting Circuits and Bulk Acoustic Wave Resonator," Piezoelectrics & Acoustooptics, 42(2):167-172. English Abstract Only.

Zhao et al., (2020). "High-contrast ZZ interaction using multitype superconducting qubits," arXiv Preprint: arXiv: 2002.07560v1, 9 pages.

Girvin et al., (2009). "Circuit QED and engineering charge based superconducting qubits," Physica Scripta, 2009:T137, 26 pages.

Kjaergaard et al., (2020). "Superconducting Qubits: Current State of Play," Annu. Rev. Condens. Matter Phys., 11:369-95.

Ku et al., (2020). "Suppression of Unwanted ZZ Interactions in a Hybrid Two-Qubit System," Phys Rev Lett., 125(20):200504, 21 pages.

Mundada et al. (2019). "Suppression of Qubit Crosstalk in a Tunable Coupling Superconducting Circuit," Department of Electrical Engineering, Princeton University, 11 pages.

Office Action for Australian Patent Application No. 2021201798, dated Feb. 24, 2022, 4 pages.

Schoelkopf et al., (2008). "Wiring up quantum systems," Nature, 451:664-669.

Yan et al., (2016). "The Flux Qubit Revisited to Enhance Coherence and Reproducibility," Nature Communications, 7:12964, 55 pages.

* cited by examiner

HIGH-FIDELITY SUPERCONDUCTING CIRCUIT STRUCTURE, SUPERCONDUCTING QUANTUM CHIP, AND SUPERCONDUCTING QUANTUM COMPUTER

CROSS-REFERENCE TO RELATED APPLICATION

This application claims priority to Chinese Patent Application No. 202010682384.5, filed on Jul. 15, 2020, which is hereby incorporated by reference in its entirety.

TECHNICAL FIELD

The present disclosure relates to the field of computer, and particularly to the field of quantum computation.

BACKGROUND

In recent years, quantum computation hardware represented by superconducting circuits has made tremendous progress in performance, wherein a very representative case is that in 2019, the Google AI Quantum team successfully realized a 53-qubit superconducting quantum chip, and achieved a random circuit sampling task thereon, thereby demonstrating the advantage of quantum.

SUMMARY

A high-fidelity superconducting circuit structure, a superconducting quantum chip, and a superconducting quantum computer are provided according to embodiments of the present disclosure.

In an aspect of the present disclosure, a superconducting circuit structure is provided according to an embodiment of the present disclosure, which includes:

computation qubits;

a coupling device configured to be coupled with two computation qubits, respectively;

a connecting component disposed between a computation qubit and the coupling device to couple the computation qubit with the coupling device, so as to implement a target quantum gate based on the coupling device and the computation qubit, wherein the computation qubit and the coupling device have different anharmonicities; by adjusting a superconducting circuit parameter in the superconducting circuit structure, a quantum state outside a computation space corresponding to the superconducting circuit structure counteracts an energy level shift caused by a quantum state inside the computation space, so as to eliminate parasitic coupling between the computation qubits and improve a fidelity of the target quantum gate.

In another aspect of the present disclosure, a superconducting quantum chip is provided according to an embodiment of the present disclosure, on which at least a superconducting circuit structure is formed, wherein the superconducting circuit structure includes the superconducting circuit structure aforementioned.

In still another aspect of the present disclosure, a superconducting quantum computer is provided according to an embodiment of the present disclosure, which is at least provided with a superconducting quantum chip and a manipulation and reading device connected to the superconducting quantum chip, wherein at least the superconducting circuit structure aforementioned is formed on the superconducting quantum chip.

It should be understood that the content described in this section is intended neither to identify the key or important features of the embodiments of the present disclosure, nor to limit the scope of the present disclosure. Other features of the present disclosure will be easily understood from the following description.

BRIEF DESCRIPTION OF THE DRAWINGS

The accompanying drawings are provided for better understanding of the solution, rather than limiting the present disclosure, wherein.

DETAILED DESCRIPTION OF THE EMBODIMENTS

Exemplary embodiments of the present disclosure are described below with reference to the accompanying drawings, including various details of the embodiments of the present disclosure to facilitate the understanding, and they should be considered as merely exemplary. Thus, it should be realized by those of ordinary skill in the art that various changes and modifications can be made to the embodiments described here without departing from the scope and spirit of the present disclosure. Also, for the sake of clarity and conciseness, the description of well-known functions and structures are omitted in the following description.

It should be noted that the superconducting circuit structure described in the solution of the present disclosure refers to a circuit implemented with superconducting devices, that is, all components used in the superconducting circuit structure are made of a superconducting material.

Although the technical solution in related art has achieved a certain degree of success, there are still many problems that need to be solved urgently, for example, ZZ parasitic coupling (i.e., a change of a state of one computation qubit will influence a frequency of another computation qubit). The existence of the ZZ parasitic coupling will directly lead to the occurrence of a quantum gate error. Therefore, how to effectively eliminate the ZZ parasitic coupling between the computation qubits has become an extremely critical proposition.

Figure 1:
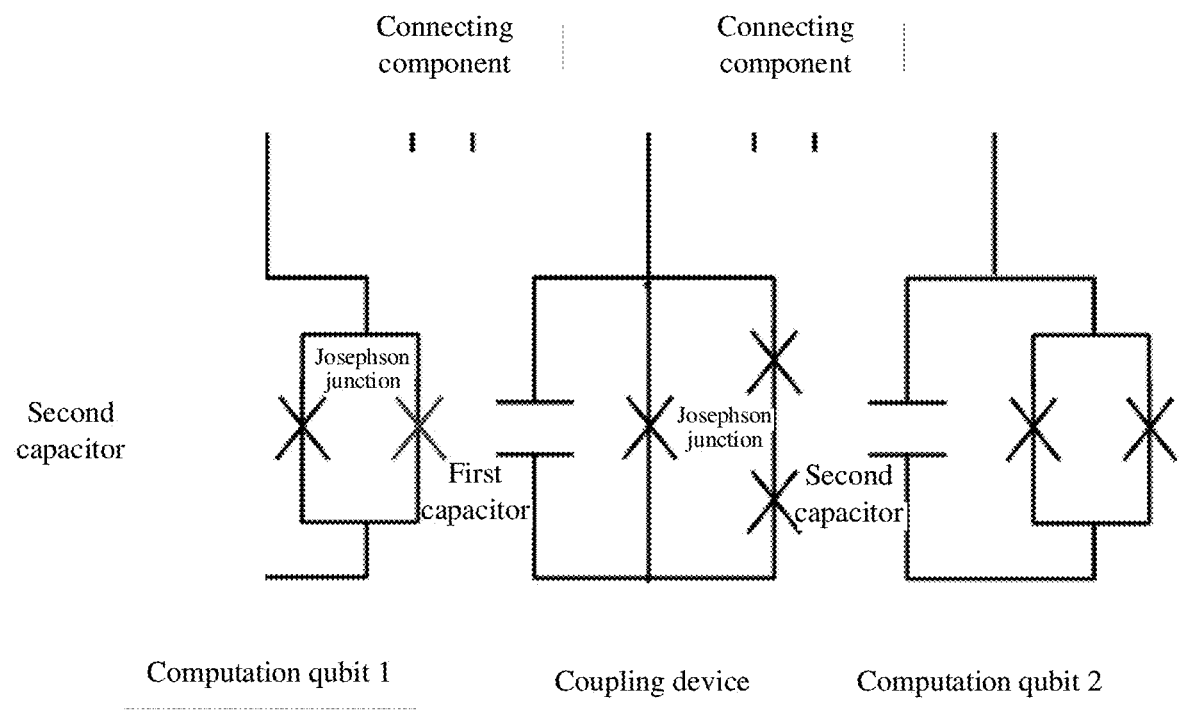
FIG. 1 shows a schematic diagram of a superconducting circuit structure according to an embodiment of the present disclosure.

On this basis, a superconducting circuit structure is provided according to an embodiment of the present disclosure. Specifically, as shown in FIG. 1, the superconducting circuit structure includes:

computation qubits, such as computation qubit 1 and computation qubit 2 as shown in FIG. 1;

a coupling device configured to be coupled with two computation qubits, respectively, for example, as shown in FIG. 1, the coupling device is coupled with the computation qubit 1 and the computation quantum qubit 2, respectively;

a connecting component disposed between a computation qubit and the coupling device to couple the computation qubit with the coupling device, so as to implement a target quantum gate based on the coupling device and the computation qubit, for example, as shown in FIG. 1, a connecting component is disposed between the coupling device and the computation qubit 1, and another connecting component is disposed between the coupling device and the computation qubit 2, thereby coupling the coupling device with the computation qubits, respectively.

The technology according to the present disclosure solves the problem that the ZZ parasitic coupling between the computation qubits cannot be effectively eliminated, and improves the fidelity of the target quantum gate.

Here, the computation qubit and the coupling device have different anharmonicities; by adjusting a superconducting circuit parameter in the superconducting circuit structure, a quantum state outside a computation space corresponding to the superconducting circuit structure counteracts an energy level shift caused by a quantum state inside the computation space, so as to eliminate parasitic coupling between the computation qubits and improve a fidelity of the target quantum gate.

In this way, the problem that the ZZ parasitic coupling between the computation qubits cannot be effectively eliminated is solved, the fidelity of the target quantum gate is improved, and a foundation is laid for improving the performance of the superconducting quantum chip.

In practical applications, the superconducting circuit parameter specifically may be the coupling strength between the computation qubits, the frequency or the anharmonicity of the computation qubit, etc.; or the frequency or the anharmonicity of the coupling device, etc.; or the coupling strength between the computation qubit and the coupling device, etc.

In the solution of the present disclosure, the computation qubit is a superconducting qubit. For instance, in an example, the computation qubit is a transmon qubit, the coupling device is a Capacitively Shunted Flux Qubit (CSFQ), and the anharmonicity of the computation qubit is a negative value, while the anharmonicity of the coupling device is a positive value.

Here, since an additional auxiliary structure, i.e., a coupling device (which may be an auxiliary qubit in an example) in the solution of the present disclosure, is introduced between the computation qubits in the solution of the present disclosure, the coupling strength between the computation qubits may be regulated, and even the coupling between the computation qubits may be turned off using the coupling device when necessary.

In the solution of the present disclosure, XY interaction exists between the computation qubits, that is, the computation qubits are coupled with each other by exchanging a virtual photon, so that a target quantum gate, such as a conventional iSWAP gate or Control Phase (CZ) gate, may be implemented. In practical applications, the target quantum gate, such as a double-qubit gate, may be implemented by applying a pulse to the coupling device.

Here, it should be noted that the superconducting circuit structure in the solution of the present disclosure may only include two computation qubits and one coupling device, and the coupling device is coupled with a computation qubit by a connecting component. On this basis, a double-qubit gate can be implemented. Of course, in practical applications, a plurality of computation qubits and a plurality of coupling devices may be included to form a superconducting circuit of a two-dimensional grid structure, in which a coupling device is disposed between two computation qubits to couple the computation qubits, while coupling between the coupling device and the computation qubit is achieved by a connecting component. In this way, the double-qubit gate may be implemented based on the superconducting circuit of a two-dimensional grid structure, thereby supporting a more complex quantum task.

In a specific embodiment, dispersive coupling is performed between the coupling device and the computation qubit, i.e., the frequency difference between the computation qubit and the coupling device is far greater than the coupling strength between the computation qubit and the coupling device. In this way, it is convenient to utilize the coupling device to regulate the coupling strength between the computation qubits, thereby laying a foundation for implementing the target quantum gate, such as the double-qubit gate.

In a specific embodiment, a frequency of the coupling device is less than that of the computation qubit in the superconducting circuit structure. In this way, it is convenient to utilize the coupling device to regulate the coupling strength between the computation qubits, thereby laying a foundation for implementing the target quantum gate, such as the double-qubit gate.

In a specific embodiment, as shown in FIG. 1, the coupling device includes a ring structure composed of Josephson junctions, and a first capacitor connected in parallel with the ring structure. In this case, the coupling device is a coupling qubit, so it is convenient to utilize the coupling device to regulate the coupling strength between the computation qubits, thereby laying a foundation for implementing the target quantum gate, such as the double-qubit gate.

In a specific embodiment, the ring structure includes at least three Josephson junctions, and the frequency of the coupling device may be changed by changing a magnetic field generated by the current flowing through the Josephson junctions, thereby laying a foundation for implementing the coupling between the coupling device and the computation qubit. Meanwhile, it is convenient to utilize the coupling device to regulate the coupling strength between the computation qubits, which lays a foundation for implementing the target quantum gate, such as the double-qubit gate.

In a specific embodiment, the computation qubit includes a superconducting quantum interference device which is coupled with the coupling device through the connecting component. Here, the frequency of the computation qubit may be changed by changing a magnetic flux passing through the superconducting quantum interference device, thereby laying a foundation for implementing the coupling between the coupling device and the computation qubit and the coupling between the computation qubits, while laying a foundation for implementing the target quantum gate, such as the double-qubit gate.

In a specific embodiment, the superconducting quantum interference device includes two Josephson junctions connected in parallel. Here, the frequency of the computation qubit may be changed by changing a magnetic field generated by the current flowing through a Josephson junction chain, thereby laying a foundation for implementing the coupling between the coupling device and the computation qubit and the coupling between the computation qubits, while laying a foundation for implementing the target quantum gate, such as the double-qubit gate.

In a specific embodiment, the computation qubit further includes a noise reduction structure configured to perform noise reduction on a charge fluctuation in an environment where the computation qubit is located.

In a specific embodiment, as shown in FIG. 1, the computation qubit further includes a second capacitor, which is connected in parallel with the superconducting quantum interference device and configured to perform noise reduction on a charge fluctuation in an environment where the computation qubit is located. Of course, in practical applications, the second capacitor included in the computation qubit can realize not only the noise reduction function, but also other basic functions required by the qubit.

In a specific embodiment, the connecting component includes at least one of a capacitor, a Josephson junction, and a resonant circuit. For instance, in an example, a circuit structure of the resonant circuit includes an inductor and a capacitor connected in parallel with the inductor. In this way, it is convenient to utilize the connecting component to implement the coupling connection between the computation qubit and the coupling device, thereby laying a foundation for implementing the coupling between the computation qubits, while laying a foundation for implementing the target quantum gate, such as the double-qubit gate.

Next, the solution of the present disclosure will be further described in detail in conjunction with specific examples. Specifically, the superconducting circuit structure of the present disclosure can eliminate the ZZ parasitic coupling by selecting an appropriate superconducting circuit parameter, thereby effectively improving the fidelity of the double-qubit gate and further improving the performance of the whole superconducting quantum chip.

Here, this example elaborates the solution of the present disclosure from the following parts: the superconducting circuit structure and the selection rule of the superconducting circuit parameter; the working principle of the superconducting circuit structure; the elimination effect of the ZZ parasitic coupling; and the error rate of the target quantum gate based on the solution of the present disclosure, which is compared with the conventional solution in the industry. Specifically:

1. The Superconducting Circuit Structure and the Parameter Selection:

The superconducting circuit structure includes two transmon qubits, i.e., a computation qubit 1 and a computation qubit 2 as shown in FIG. 1, and a CSFQ (a coupling device as shown in FIG. 1) coupled therewith. Each of the transmon qubits is coupled with the intermediate CSFQ through a connecting component, such as a capacitor. Here, as shown in FIG. 1, the CSFQ includes a ring structure composed of three Josephson junctions, and a first capacitor connected in parallel with the ring structure. The Transmon qubit includes a superconducting quantum interference device and a second capacitor connected in parallel with the superconducting quantum interference device, wherein the superconducting quantum interference device includes two Josephson junctions connected in parallel.

In the superconducting circuit, the ZZ parasitic coupling can be eliminated by designing a reasonable superconducting circuit parameter, and a quantum gate with a high fidelity can be implemented.

Here, the Hamiltonian of the superconducting circuit is:

$$\hat{H} = \sum_{k=q1,q2,c} \omega_k \hat{a}_k^\dagger \hat{a}_k + \frac{a_k}{2} \hat{a}_k^\dagger \hat{a}_k^\dagger \hat{a}_k \hat{a}_k + \sum_{j=q1,q2,} q_j(\hat{a}_j^\dagger + \hat{a}_j)(\hat{a}_c^\dagger + \hat{a}_c), \quad (1)$$

wherein $\omega_k$ and $\alpha_k$ represent the frequency and the anharmonicity of the computation qubit (or the coupling device), respectively, wherein k=q1, c, q2, which are corresponding to the calculation qubit 1, the calculation qubit 2, and the coupling device, respectively; $g_j$ represents the coupling strength between the computation qubit and the coupling qubit, wherein j=q1, q2, and for example, $g_{q1}$ represents the coupling strength between the computation qubit 1 and the coupling device, and $g_{q2}$ represents the coupling strength between the computation qubit 2 and the coupling device. In addition, $\hat{a}_k^\dagger$ and $\hat{a}_k$ represent shift operators for the computation qubit and the coupling device, respectively.

It should be pointed out that the superconducting circuit described in the solution of the present disclosure satisfies the following conditions:

(1) The frequency difference between the computation qubit (such as the computation qubit 1 or 2) and the coupling device is far greater than the coupling strength between the computation qubit (such as the computation qubit 1 or 2) and the coupling device, that is, dispersive coupling is required between the computation qubit (such as the computation qubit 1 or 2) and the coupling device, i.e., $$g_{q1}/|\omega_{q1}-\omega_c|<<1;\ g_{q2}/|\omega_{q2}-\omega_c|<<1.$$

(2) The anharmonicity of the computation qubit (such as the computation qubit 1 or 2) is a negative value, i.e., $\alpha_{q1}<0$ or $\alpha_{q2}<0$, and a transmon qubit is adopted in this solution; while the anharmonicity of the coupling device is a positive value, i.e., $\alpha_c>0$, and CSFQ is adopted in this solution.

(3) The frequency of the coupling device is less than that of the computation qubit (such as the computation qubit 1 or 2).

2. The Working Principle of the Superconducting Circuit Structure:

Here, the physical mechanism of the solution of the present disclosure to implement the high-fidelity quantum gate is explained from the perspective of the energy level. Specifically, by performing a Schiffer-Wolf transformation on the Hamiltonian of the above equation (1), the coupling device may be decoupled to obtain an effective Hamiltonian in the superconducting circuit structure, the coupling between the quantum states such as |100⟩ and |001⟩ inside the computation space (e.g., it may be used to implement the target quantum gate iSWAP), is accompanied with inevitable parasitic coupling, such as the coupling between the quantum state |101⟩ inside the computation space and the quantum states |200⟩, |020⟩ and |002⟩ outside the computation space. Under the adiabatic regulation (i.e., it is assumed that no energy level leakage is caused), the coupling (i.e., parasitic coupling) between the quantum state inside the computation space and the quantum state outside the computation space will cause an energy level shift of the quantum state such as |101⟩ inside the computation space, i.e., the ZZ parasitic coupling is induced. Here, by selecting different superconducting circuit parameters, the energy amount corresponding to each energy level may be regulated, so that the corresponding energy level of |101⟩ shifts upward or downward. On this basis, the solution of the present disclosure eliminates the ZZ parasitic coupling, i.e., controls the energy level shifts, which are caused by the coupling between the quantum state such as |101⟩ inside the computation space and the quantum states such as three high-level quantum states |200⟩, |020⟩ and |002⟩ outside the computation space, to counteract with each other, i.e., controls the overall effect of the energy level shifts so that |101⟩ has no energy level shift, thereby eliminating the parasitic coupling and improving the fidelity of the target quantum gate. That is, in the superconducting circuit parameter interval of the solution of the present disclosure, an appropriate superconducting circuit parameter (e.g., within a specific superconducting circuit parameter interval) can be obtained by adjustment, thereby eliminating the ZZ parasitic coupling and obtaining a high-fidelity quantum gate.

3. Elimination Effect of the ZZ Parasitic Coupling:

Based on analyses of the superconducting circuit structure and the physical mechanism designed above, and adopting the aforementioned specific superconducting circuit parameter interval which can eliminate the ZZ parasitic coupling, the strength of the ZZ parasitic coupling can be obtained.

Specifically, the superconducting circuit parameters are selected as follows:

$$\omega_{q1}/2\pi = \omega_{q2}/2\pi = 5 \text{ GHz};$$

$$\omega_c = 2\pi = 4.61 \text{ GHz};$$

$$g_{c1}/2\pi = g_{c2}/2\pi = 0.04 \text{ GHz; and}$$

$$\alpha_c/2\pi = 1.4 \text{ GHz}.$$

Figure 2:
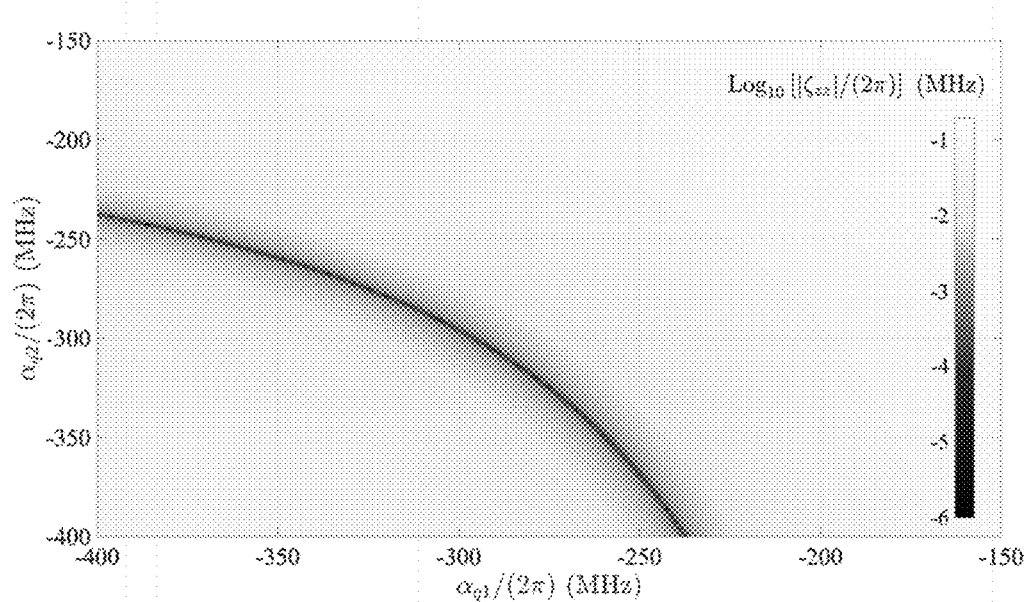
FIG. 2 is a schematic diagram showing variation characteristics of ZZ parasitic coupling strength $\zeta_{ZZ}$ with anharmonicities $\alpha_{q1}$ and $\alpha_{q2}$ of computation qubits in a specific example of a superconducting circuit structure according to an embodiment of the present disclosure.

By numerically diagonalizing the equation (1) of the Hamiltonian of the superconducting circuit, variation characteristics of the ZZ parasitic coupling strength between the computation qubits with the anharmonicities ($\alpha_{q1}$, $\alpha_{q2}$) of the computation qubits can be determined. As shown in FIG. 2, it can be clearly seen from the numerical simulation result, by adopting the solution of the present disclosure and designing reasonable superconducting circuit parameters, the ZZ parasitic coupling between the computation qubits can be effectively eliminated. Specifically, when a nonlinear strength (i.e., anharmonicity) of the computation qubit in the superconducting circuit structure in the solution of the present disclosure is designed as a reasonable parameter, e.g., when a parameter range corresponding to the curve shown in FIG. 2 is selected, the ZZ parasitic coupling is suppressed and even eliminated.

Figure 3:
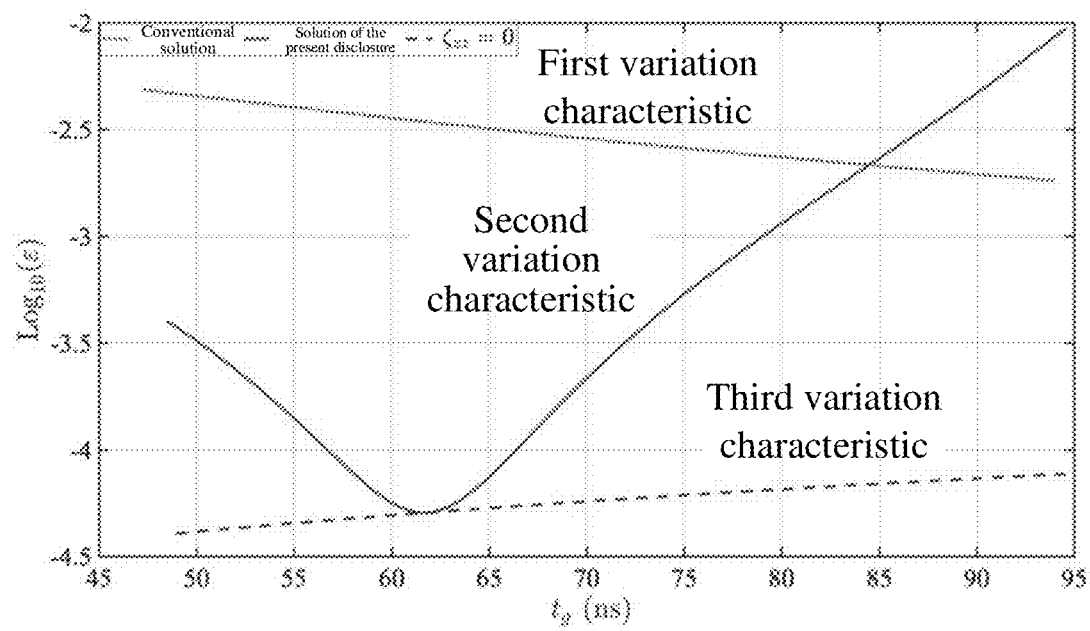
FIG. 3 is a schematic diagram showing variation characteristics of an iSWAP quantum gate error rate $\varepsilon$ with a quantum gate duration $t_g$ in a specific example of a superconducting circuit structure according to an embodiment of the present disclosure.
Figure 4:
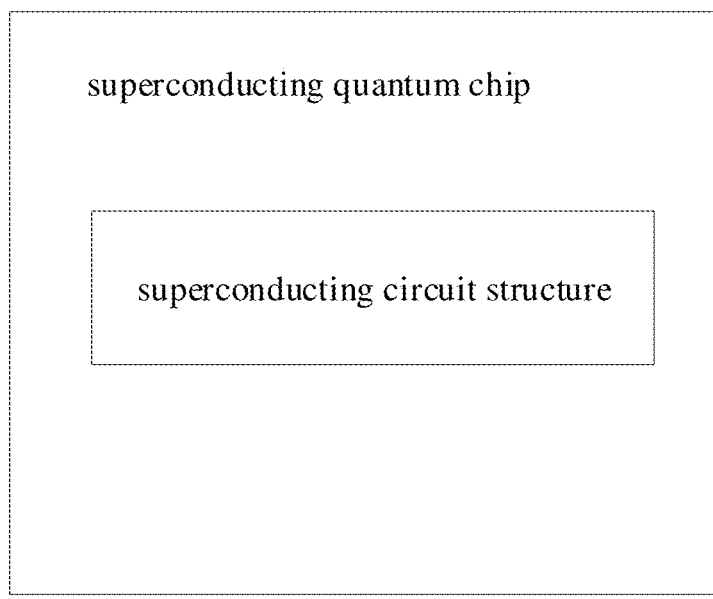
FIG. 4 is a schematic of a superconducting quantum chip.
Figure 5:
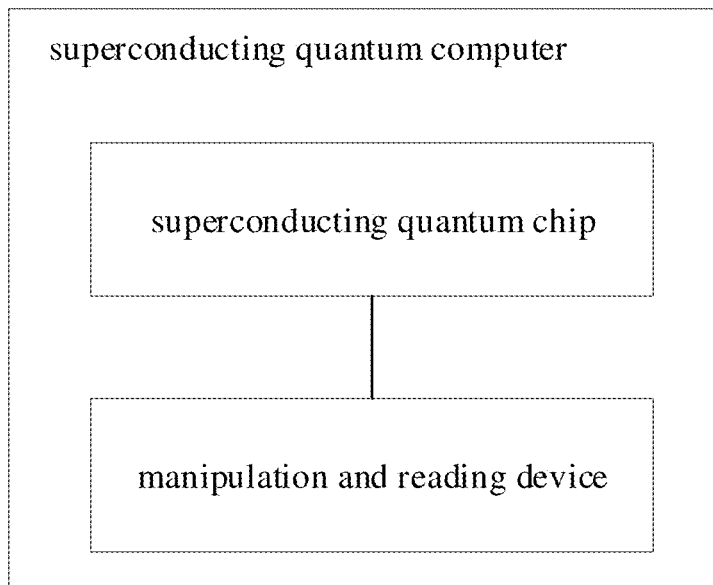
FIG. 5 is a schematic of an exemplary superconducting quantum computer.

4. The Realization Effect of the Error Rate of the Target Quantum Gate:

By adopting the superconducting circuit parameters selected above while considering the energy dissipation effect of the computation qubit, the solution of the present disclosure is analyzed and applied to realize the error rate of the iSWAP quantum gate. Specifically, FIG. 3 shows a numerical simulation result. As shown in FIG. 3, a first variation characteristic represents an error rate of a conventional solution in the industry, a second variation characteristic represents an error rate of the iSWAP quantum gate implemented by the solution of the present disclosure, and a third variation characteristic represents an error rate without considering the ZZ parasitic coupling. A lower quantum gate error rate can be obtained by applying the solution of the present disclosure, wherein the error rate can be reduced by two orders of magnitude compared with the conventional solution in the industry.

Here, the superconducting circuit parameters used in FIG. 3 are:

$$\omega_{q1}/2\pi = \omega_{q2}/2\pi = 5 \text{ GHz},$$

$$\alpha_{q1}/2\pi = \alpha_{q2}/2\pi = -0.3 \text{ GHz},$$

$$g_{q1}/2\pi = g_{q2}/2\pi = 0.04 \text{ GHz},$$

$$\alpha_c/2\pi = 1.4 \text{ GHz, and}$$

$$\gamma_{q1} = \gamma_{q2} = \gamma_c = 1/(100 \text{ μs}).$$

In this way, since the ZZ parasitic coupling between the computation qubits can be greatly suppressed and even eliminated by applying the solution of the present disclosure, the fidelity of the target quantum gate is ultimately mainly limited by the energy dissipation rate of the computation qubits. In practical applications, in order to obtain a lowest quantum gate error rate, it is necessary to adjust the frequency of the coupling device in addition to selecting the appropriate superconducting circuit parameter. When the frequency is adjusted to a certain value, the ZZ parasitic coupling can be well eliminated to obtain a high fidelity of the quantum gate.

To sum up, the solution of the present disclosure can implement a double-qubit gate with a high fidelity. Meanwhile, compared with other technical solutions, the solution of the present disclosure has the following advantages:

The circuit structure is simple, conveniently extendable, and highly implementable. The design of the superconducting circuit structure in the solution of the present disclosure is very simple, and can be easily extended to a superconduct circuit including a plurality of qubits. Moreover, the transmon qubit and the CSFQ adopted in the solution of the present disclosure are both easily implementable.

The flexibility is high. Even if there is a deviation in the design of the superconducting circuit parameter design, the ZZ parasitic coupling between the computation qubits still can be eliminated by adjusting the frequency of the coupling device such as the coupling qubit later.

In the solution of the present disclosure, owing to the characteristics of the dispersive coupling between the computation qubits 1 and 2 and the coupling device, the overall fidelity will not be greatly affected even if the coupling device adopts the CSFQ with a large energy dissipation rate.

In addition, it is helpful to implement a quantum gate with a higher fidelity, since the transmon, which is stable and has a long coherence time, is taken as the computation qubit.

A new possibility is brought to implement a quantum gate with a high fidelity in a superconducting circuit architecture including a coupling device. That is, the solution of the present disclosure realizes the elimination of the ZZ parasitic coupling without increasing the circuit complexity, thereby implementing a quantum gate with a high fidelity.

A superconducting quantum chip is further provided according to an embodiment of the present disclosure, on which at least a superconducting circuit structure is formed, wherein the superconducting circuit structure includes the superconducting circuit structure described above.

It should be pointed out here that the superconducting circuit structure in the above superconducting quantum chip is similar to the aforementioned structure and achieves the same beneficial effects as the above embodiments of the superconducting circuit structure, which will not be repeated. For the technical details not disclosed in the embodiments of the superconducting quantum chip in the present disclosure, those skilled in the art should refer to the above description of the superconducting structure, which will not be repeated here.

A superconducting quantum computer is further provided according to an embodiment of the present disclosure, which is at least provided with a superconducting quantum chip and a manipulation and reading device connected to the superconducting quantum chip, wherein at least the superconducting circuit structure described above is formed on the superconducting quantum chip.

It should be pointed out here that the superconducting circuit structure in the above superconducting quantum computer is similar to the aforementioned structure and achieves the same beneficial effects as the above embodiments of the superconducting circuit structure, which will not be repeated. For the technical details not disclosed in the embodiments of the superconducting quantum computer in the present disclosure, those skilled in the art should refer to the above description of the superconducting structure, which will not be repeated here.

The technical solutions according to the embodiments of the present disclosure solve the problem that the ZZ parasitic coupling between the computation qubits cannot be effectively eliminated, and improves the fidelity of the target quantum gate.

In the description of the present disclosure, the description of reference terms 'one embodiment', 'some embodiments', 'an example', 'a specific example' or 'some examples' and the like mean that the specific features, structures, materials, or characteristics described in conjunction with the embodiment(s) or example(s) are included in at least one embodiment or example of the present disclosure. Moreover, the specific features, structures, materials, or characteristics described can be combined in any one or more embodiments or examples in a suitable manner. In addition, those skilled in the art can combine different embodiments or examples described in the present disclosure and features thereof if there is no contradiction.

In addition, the terms 'first' and 'second' are only used for a descriptive purpose, and cannot be understood as indicating or suggesting relative importance or implicitly pointing out the number of the indicated technical features. Therefore, the features defined with 'first' and 'second' can include at least one of the features explicitly or implicitly. In the description of the present disclosure, 'a plurality of' means two or more, unless otherwise specifically defined.

The specific embodiments do not limit the protection scope of the present disclosure. It should be understood by those skilled in the art that various modifications, combinations, sub-combinations and replacements can be made according to the design requirements and other factors. Any modification, equivalent replacement, improvement, etc. made under the spirit and principle of the present disclosure should fall within the protection scope of the present disclosure.

What is claimed is:

1. A superconducting circuit structure, comprising:
   computation qubits;
   a coupling device configured to be coupled with two computation qubits, respectively;
   a connecting component disposed between a computation qubit and the coupling device to couple the computation qubit with the coupling device, so as to implement a target quantum gate based on the coupling device and the computation qubit,
   wherein the computation qubit and the coupling device have different anharmonicities, and a superconducting circuit parameter in the superconducting circuit structure is adjusted to cause a quantum state outside a computation space corresponding to the superconducting circuit structure to counteract an energy level shift caused by a quantum state inside the computation space,
   wherein the superconducting circuit structure satisfies following conditions: dispersive coupling is performed between the coupling device and the computation qubit; anharmonicity of the computation qubit is a negative value and anharmonicity of the coupling device is a positive value, and a frequency of the coupling device is less than that of the computation qubit in the superconducting circuit structure.

2. The superconducting circuit structure according to claim 1, wherein the coupling device comprises a ring structure composed of Josephson junctions, and a first capacitor connected in parallel with the ring structure.

3. The superconducting circuit structure according to claim 2, wherein the ring structure comprises at least three Josephson junctions.

4. The superconducting circuit structure according to claim 1, wherein the computation qubit comprises a superconducting quantum interference device which is coupled with the coupling device through the connecting component.

5. The superconducting circuit structure according to claim 4, wherein the superconducting quantum interference device comprises two Josephson junctions connected in parallel.

6. The superconducting circuit structure according to claim 4, wherein the computation qubit further comprises a noise reduction structure configured to perform noise reduction on a charge fluctuation in an environment where the computation qubit is located.

7. The superconducting circuit structure according to claim 5, wherein the computation qubit further comprises a noise reduction structure configured to perform noise reduction on a charge fluctuation in an environment where the computation qubit is located.

8. The superconducting circuit structure according to claim 4, wherein the computation qubit further comprises a second capacitor, which is connected in parallel with the superconducting quantum interference device and configured to perform noise reduction on a charge fluctuation in an environment where the computation qubit is located.

9. The superconducting circuit structure according to claim 5, wherein the computation qubit further comprises a second capacitor, which is connected in parallel with the superconducting quantum interference device and configured to perform noise reduction on a charge fluctuation in an environment where the computation qubit is located.

10. The superconducting circuit structure according to claim 1, wherein the connecting component comprises at least one of a capacitor, a Josephson junction, and a resonant circuit.

11. A superconducting quantum chip, on which at least a superconducting circuit structure is formed, wherein the superconducting circuit structure comprises the superconducting circuit structure according to claim 1.

12. A superconducting quantum computer, which is at least provided with a superconducting quantum chip and a manipulation and reading device connected to the superconducting quantum chip, wherein at least the superconducting circuit structure according to claim 1 is formed on the superconducting quantum chip.

13. A superconducting quantum computer, which is at least provided with a superconducting quantum chip and a manipulation and reading device connected to the superconducting quantum chip, wherein at least the superconducting circuit structure according to claim 2 is formed on the superconducting quantum chip.

14. A superconducting quantum computer, which is at least provided with a superconducting quantum chip and a manipulation and reading device connected to the superconducting quantum chip, wherein at least the superconducting circuit structure according to claim 3 is formed on the superconducting quantum chip.

15. A superconducting quantum computer, which is at least provided with a superconducting quantum chip and a manipulation and reading device connected to the superconducting quantum chip, wherein at least the superconducting circuit structure according to claim 4 is formed on the superconducting quantum chip.

16. A superconducting quantum computer, which is at least provided with a superconducting quantum chip and a manipulation and reading device connected to the superconducting quantum chip, wherein at least the superconducting circuit structure according to claim 5 is formed on the superconducting quantum chip.

* * * * *